(12) United States Patent
Bruekers

(10) Patent No.: US 6,266,368 B1
(45) Date of Patent: Jul. 24, 2001

(54) DATA COMPRESSION/EXPANSION ON A PLURALITY OF DIGITAL INFORMATION SIGNALS

(75) Inventor: Alphons A. M. L. Bruekers, Eindhoven (NL)

(73) Assignee: U.S. Philips Corporation, New York, NY (US)

(*) Notice: Subject to any disclaimer, the term of this patent is extended or adjusted under 35 U.S.C. 154(b) by 0 days.

(21) Appl. No.: 09/007,551

(22) Filed: Jan. 15, 1998

(30) Foreign Application Priority Data

Jan. 16, 1997 (EP) .................................................. 97200104

(51) Int. Cl.[7] .................................................. H04B 1/66
(52) U.S. Cl. .................................................. 375/240; 704/500
(58) Field of Search .................................................. 341/65, 67, 76, 341/77; 704/500, 503; 375/240

(56) References Cited

U.S. PATENT DOCUMENTS

| | | | |
|---|---|---|---|
| 5,818,943 | * 10/1998 | Ten Kate | 381/27 |
| 5,878,080 | * 3/1999 | Ten Kate | 375/241 |
| 5,995,493 | * 11/1999 | Van de Kerkhof | 370/286 |
| 6,023,490 | * 2/2000 | Ten Kate | 375/240 |
| 6,041,302 | * 3/2000 | Bruekers | 704/503 |

FOREIGN PATENT DOCUMENTS

0402973A1  12/1990  (EP) .

OTHER PUBLICATIONS

"A Universal Algorithm For Sequential Data Compression", by Jacob Ziv et al., IEEE Transactions on Information Theory, vol. IT–23, No. 3, May 1977, pp. 337–343.

"A Method For The Construction of Minimum–Redundancy Codes", by David A. Huffman, Proceedings of The I.R.E., pp. 1098–1103.

"An Introduction To Arithmetic Coding", by Glen G. Langodn, Jr., IBM J. Res. Develop. vol. 28, No. 2, Mar. 1984, pp. 135–149.

* cited by examiner

Primary Examiner—Temesghen Ghebretinsae
(74) Attorney, Agent, or Firm—Michael E. Belk

(57) ABSTRACT

A data compression apparatus is proposed for data compressing at least a first and a second digital information signal ($L_0, L_1, L_2, \ldots, R_0, R_1, R_2, \ldots$), each of the at least two digital information signals comprising subsequent samples. The apparatus comprises an input (1,2) for receiving the first and second digital information signal, a merging unit (6) for merging the samples of the first and second digital information signal after each other into one datastream so as to obtain a composite information signal ($L_0, R_0, L_1, R_1, L_2, R_2, \ldots$). Further, a data compression unit (12) is available for data compressing the composite information signal so as to obtain a data compressed composite information signal and an output (16) is present for supplying the data compressed composite information signal.

22 Claims, 4 Drawing Sheets

DATA COMPRESSION/EXPANSION ON A PLURALITY OF DIGITAL INFORMATION SIGNALS

BACKGROUND OF THE INVENTION

The invention relates to a data compression apparatus for data compressing at least a first and a second digital information signal, each of the at least two digital information signals comprising subsequent samples, the apparatus comprising:

means for receiving the first and second digital information signal, signal combination means for combining the first and second digital information signal so as to obtain a composite information signal, data compression means for data compressing the composite information signal so as to obtain a data compressed composite information signal, output means for supplying the data compressed composite information signal, to a data expansion apparatus for data expanding a data compressed composite information signal obtained from at least a first and a second digital information signal, the apparatus comprising input means for receiving the data compressed composite information signal, data expansion means for data expanding the data compressed composite information signal so as to obtain a data expanded composite information signal, retrieval means for retrieving a replica of the first and second digital information signal from the data expanded composite information signal, output means for supplying the replicas of at least the first and second digital information signals, to a transmitter comprising the data compression apparatus, to a receiver comprising the data expansion apparatus, to a method for data compression, to a method for data expansion and to a record carrier.

Data compressing a stereo audio signal is well known in the art. Reference is made in this respect to EP-A 402,973, document D1 in the list of related documents. The document describes a subband coder, in which each of the left and right hand signal components of the stereo audio signal is A/D converted with a specific sampling frequency, such as 44.1 kHz, and the resulting samples in de form of eg. 24 bits wide words of the audio signal, are supplied to a subband splitter filter. The subband splitter filter splits the audio signal component into a plurality of relatively narrow band subband signals. Using a psycho acoustic model, a masked threshold is derived and blocks of samples of the subband signals are subsequently quantised with a specific number of bits per sample for each block of the subband signals, in response to said masked threshold, resulting in a significant data compression of the audio signal to be transmitted. The data compression carried out is based on 'throwing away' those components in the audio signal that are inaudible and is thus a lossy compression method.

In an intensity stereo mode, a further data reduction can be obtained by combining, in the same subband, samples of the subband signals of the left and right hand signal components of the stereo audio signal, by adding them so as to obtain samples of a composite subband signal and carrying out a data compression on the composite subband signal.

The data compression described in document D1 is a rather intelligent data compression method and requires a substantial number of gates or instructions, when realized in hard or software respectively, so that it is expensive. Moreover, the subsequent expansion apparatus also requires a substantial number of gates or instructions, when realized in hardware or software respectively.

SUMMARY OF THE INVENTION

The invention aims at providing a data processing apparatus for data compressing at least a first and a second digital information signal such that the information signals can be data compressed in a more simple way, with a simpler data compressor, such as a lossless coder. Further, the corresponding expander apparatus can also be more simple and less expensive.

The data compression apparatus in accordance with the invention comprises merging means for merging samples of the first and second digital information signal after each other into one datastream so as to obtain said composite information signal, said data compression means having a control input for receiving a control signal, the data compression means being adapted to data compress the composite information signal in response to said control signal, control signal generation means being available, for generating said control signal, said control signal generation means having an input for receiving said composite information signal and being adapted to generate said control signal in response to said composite information signal.

Preferred embodiments of the data compression apparatus, a corresponding data expansion apparatus, a transmitter comprising the data compression apparatus, a receiver comprising the data expansion apparatus and a record carrier, are the subject of the subclaims.

BRIEF DESCRIPTION OF THE DRAWING

These and other aspects of the invention will be apparent from and elucidated further with reference to the embodiments described in the following figure description, in which.

DESCRIPTION OF THE PREFERRED EMBODIMENTS

Figure 1:
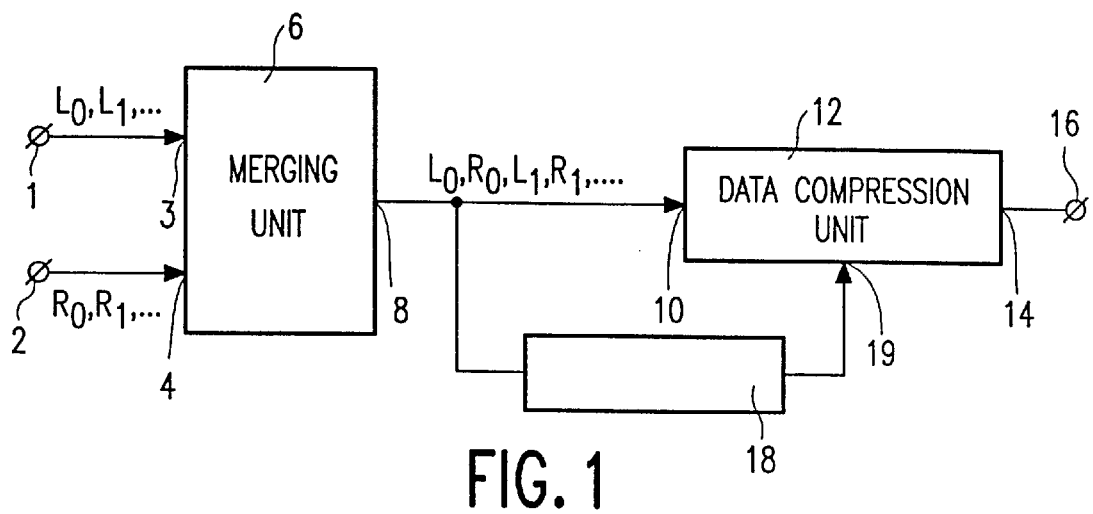
FIG. 1 shows an embodiment of the data compression apparatus.

FIG. 1 shows an embodiment of the data compression apparatus in accordance with the invention, comprising an input terminal 1 for receiving samples $L_0, L_1, L_2, \ldots$ of a first digital information signal and an input terminal 2 for receiving samples $R_0, R_1, R_2, \ldots$ of a second digital information signal. In the present example, the first and second digital information signals are the left and right hand signal components respectively of a stereo audio signal.

The input terminal 1 is coupled to a first input 3 of a merging unit 6. The input terminal 2 is coupled to a second input 4 of the merging unit 6. An output 8 of the merging unit 6 is coupled to an input 10 of a data compression unit 12, which has an output 14 coupled to an output terminal 16. Further, a control signal generation unit 18 is available, having an input coupled to the output 8 of the merging unit 6 and an output coupled to a control signal input 19 of the data compression unit 12.

The apparatus of FIG. 1 functions in the following way. The samples of the left and right hand signal components of the stereo audio signal are supplied to the merging unit 6, which merges the samples in such a way into one composite datastream that the samples in the composite signal are arranged in the following sequence:

$$L_0, R_0, L_1, R_1, L_2, R_2, L_3, \ldots$$

The composite signal thus obtained is supplied to the data compression unit 12, which is preferably in the form of a lossless data compression encoder, such as a Huffman type encoder or an arithmetic coder.

Lossless encoders have the advantage that they can data compress an information signal in such a way that, after data expansion by a lossless decoder, the original information signal can be reconstructed in a substantially lossless way. That means that there is substantially no loss of information after compression-expansion. Lossless coders can be in the form of a variable length coder. Variable length coders are well known in the art. Examples of such variable length coders are (the already mentioned) Huffman coders, arithmetic coders and Lempel-Ziv coders. Reference is made in this respect to the publications 'A method for the construction of minimum-redundancy codes' by D. A. Huffman, document D2 in the list of related documents, 'An introduction to arithmetic coding' by G. G. Langdon, document D3 in the list of related documents, and 'A universal algorithm for sequential data compression' by J. Ziv et al, document D4 in the list of related documents.

The data compression unit 12 carries out a data compression step on the composite signal under the influence of the control signal supplied to its control input 19 and generates in response thereto a data compressed composite signal at its output 14.

The control signal generator unit 18 generates the control signal in response to the composite signal present at the output 8 of the merging unit 6. In the situation where the compression unit 12 is in the form of a Huffman encoder, the control signal at the input 19 is a statistical signal representing the probability of occurrence of samples having a specific amplitude. In the situation where the compression unit 12 is in the form of an arithmetic coder, the control signal in the same way is a statistical signal representing probabilities of occurrence of samples in the composite signal.

A comparison of the compression ratio obtained with the apparatus of FIG. 1 with the compression ratio obtained with separately data compression the two digital information signals, revealed that the apparatus of FIG. 1 had a 4% better performance.

Data compression can be carried out on a blockwise basis. Blocks of a plurality of the samples of the composite information signal can be data compressed by the data compression unit 12. Such blocks can be obtained such that they comprise a sample $(L_i)$ of the first information signal first, followed by a sample $(R_i)$ of the second information signal. Blocks can be preceded by a sync word. This enables a subsequent splitting of the composite signal into the separate information signals upon reception in a corresponding data expansion apparatus.

Figure 2:
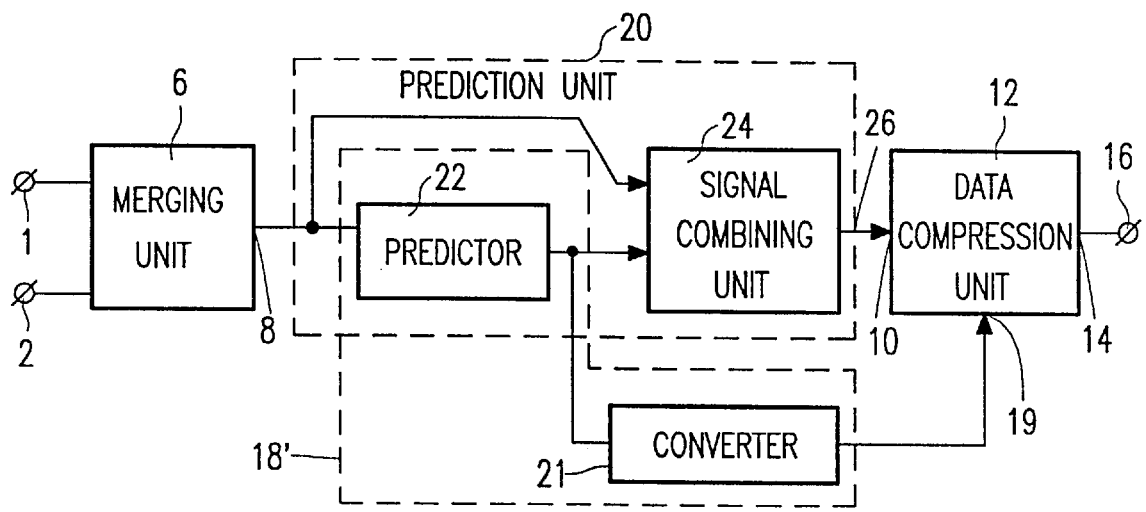
FIG. 2 shows another embodiment of the data compression apparatus.

FIG. 2 shows another embodiment of the, compression apparatus in accordance with the invention. The compression apparatus of FIG. 2 shows a large resemblance with the apparatus of FIG. 1. The apparatus of FIG. 2 comprises all the elements already discussed with reference to FIG. 1, and further comprises a prediction unit 20, coupled between the merging unit 6 and the data compression unit 12. The prediction unit 20 comprise a predictor 22 and a signal combining unit 24, which is in the form of a subtractor. The predictor generates a prediction of the signal applied to its input and supplies the predicted version at its output. The signal combination unit 24 subtracts the original composite signal from the predicted version so as to obtain a residual signal, which is supplied to the output 26 of the prediction unit 20.

FIG. 2 shows in addition a further elaboration of the control signal generator unit 18', which comprises a series connection of the predictor 22 and a converter unit 21. The converter unit 21 generates the statistical signal, used as the control signal for the data compression unit 12, from the predictor output signal.

It should be noted here that the circuit construction of the predictor 22 and the signal combination unit 24 in the prediction unit 20 can be different from the circuit construction shown in FIG. 2. As an example, the predictor 22 could have been coupled in a feedback path from the output of the signal combination unit 24 to the second input of that same combination unit 24, see also FIG. 8. In such embodiment, the predictor 22 generates the predicted version of the signal applied to the first input of the combination unit 24 from the residual signal.

Figure 3:
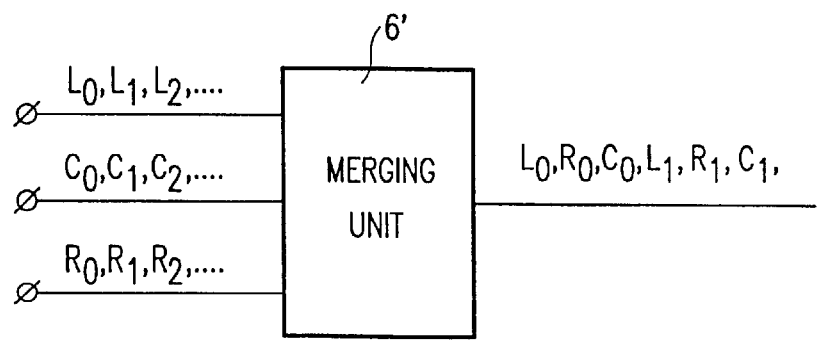
FIG. 3 shows another embodiment of the merging unit.

A merging unit of again another embodiment of the data compression apparatus is shown in FIG. 3. The merging unit 6' of FIG. 3 is capable of merging three information signal into a composite signal. In the present example, the three information signals are the left and right hand signal component of a stereo audio signal and a corresponding centre signal. The samples are merged into one datastream of the composite signal as follows:

$$L_0, R_0, C_0, L_1, R_1, C_1, L_2, R_2, C_2, \ldots$$

Other sequences could have been generated as well. Such as different orders, or each time merging eg. two samples of the same signal.

Figure 4:
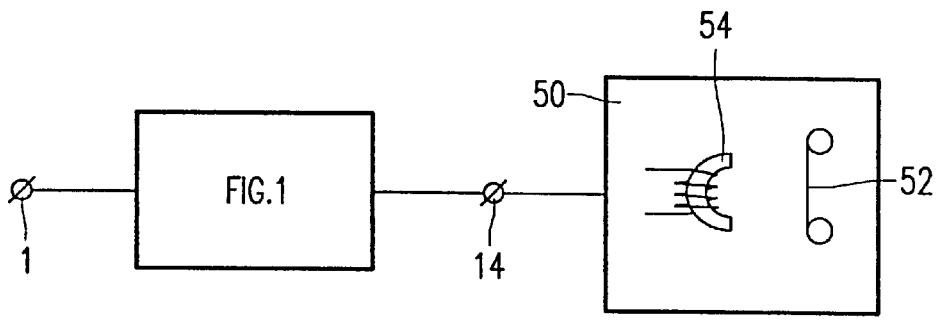
FIG. 4 shows the data compression apparatus of FIG. 1 incorporated in a recording apparatus for recording the data compressed composite signal on a record carrier.

FIG. 4 shows an embodiment of a recording apparatus comprising the data compression apparatus shown in FIG. 1, which may include the prediction unit shown in FIG. 2. The recording apparatus further comprises a write unit 50 for writing data compressed composite signal in a track on the record carrier 52. In the present example, the record carrier 52 is a magnetic record carrier, so that the write unit 50 comprises at least one magnetic head 54 for writing the data compressed composite signal in the record carrier 52. The record carrier may however be an optical record carrier, such as a CD disk or a DVD disk.

Figure 5:
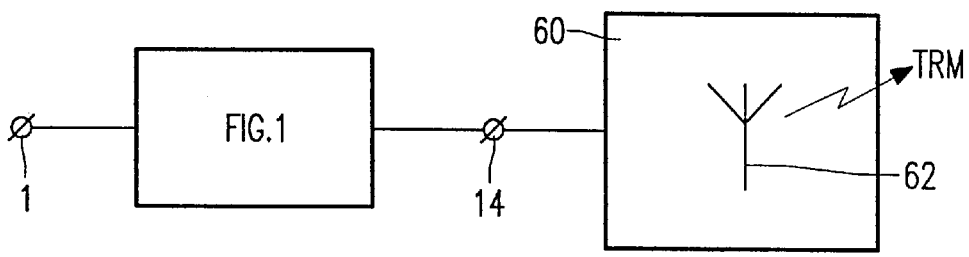
FIG. 5 shows the data compression apparatus incorporated in a transmission apparatus for transmitting the data compressed composite signal via a transmission medium.

FIG. 5 shows an embodiment of a transmitter for transmitting the data compressed composite signal via a transmission medium TRM, comprising the data compression apparatus as shown in FIG. 1, which again may include the prediction unit shown in FIG. 2. The transmitter further comprises a transmission unit 60 for applying the data compressed composite signal to the transmission medium TRM. The transmission unit 60 could comprise an antenna 62.

Figure 6:
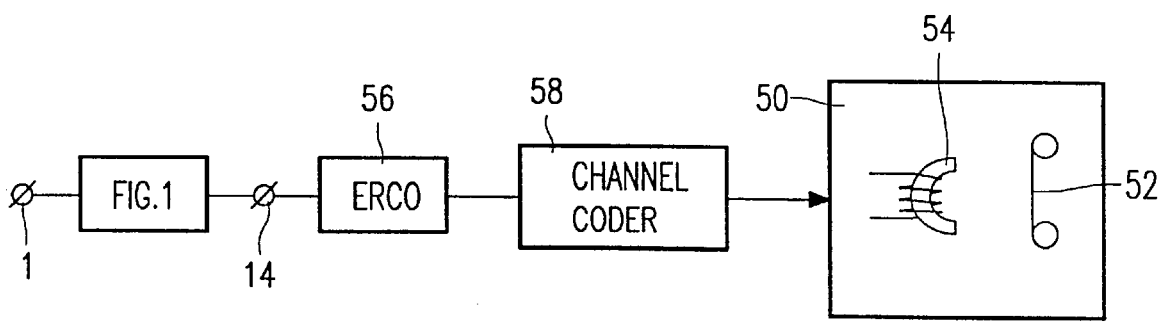
FIG. 6 shows a further embodiment of the recording apparatus, further provided with an error correction encoder and a channel encoder.

Transmission via a transmission medium, such as a radio frequency link or a record carrier, generally requires an error correction encoding and a channel encoding carried out on the data compressed composite signal to be transmitted. FIG. 6 shows such signal processing steps carried out on the data compressed composite signal for the recording arrangement of FIG. 4. The recording arrangement of FIG. 6 therefore comprise an error correction encoder 56, well known in the art, and a channel encoder 58, also well known in the art.

Figure 7:
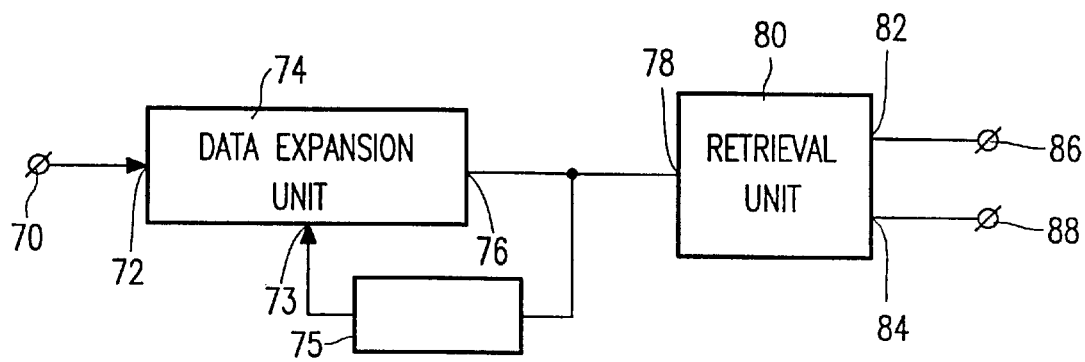
FIG. 7 shows an embodiment of a data expansion apparatus for data expanding the data compressed composite signal into replicas of the original information signals.

FIG. 7 shows an embodiment of the data expansion apparatus in accordance with the invention, which is capable of reconverting the data compressed composite signal into replicas of the original left and right hand signal components of the stereo audio signal. The apparatus has an input terminal 70 for receiving the data compressed composite signal, as supplied by the data compression apparatus of FIG. 1. The input terminal 70 is coupled to an input 72 of a data expansion unit 74, which has an output 76 coupled to an input 78 of a retrieval unit or means 80. The retrieval unit 80 has two outputs 82 and 84, coupled to a first and second output terminal 86 and 88 respectively.

The data expansion unit 74 has a control input 73 for receiving a control signal. The data expansion unit 74 is adapted to data expand the data compressed composite information signal in response to a control signal supplied to said control signal input 73, so as to obtain a data expanded composite information signal at its output 76. A control signal generation unit 75 is present, having an input coupled to the output 76 and an output coupled to the input 73 of the expansion unit 74.

The apparatus of FIG. 7 receives the data compressed composite signal via its input 70, which is supplied to the input 72 of the data expansion unit 74. The data expansion unit 74 carries out a data expansion step on the data compressed composite signal, which data expansion step is the inverse of the data compressions step carried out by the data compression unit 12 of FIG. 1. As a result, a replica of the original composite signal will be generated and supplied to the output 76. The replica of the composite signal is supplied to the retrieval unit 80. The retrieval unit 80 splits the datastream applied to its input into two streams by supplying the odd numbered samples in the composite signal to the one output, eg. the output 82, and the even numbered samples to the other output. As a result, replicas of the left and right hand signal components of the stereo audio signal appear at the terminals 86 and 88 respectively.

The control signal generator 75 generates said control signal in response to said data expanded composite information signal.

Figure 8:
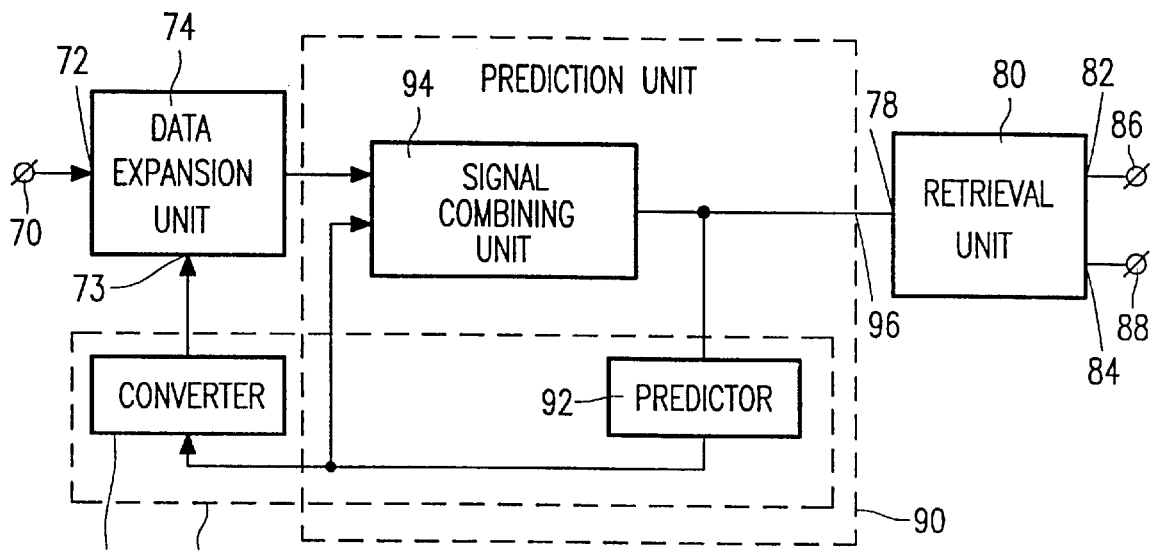
FIG. 8 shows another embodiment of the data expansion apparatus.

FIG. 8 shows another embodiment of the expansion apparatus in accordance with the invention. The expansion apparatus of FIG. 8 shows a large resemblance with the apparatus of FIG. 7. The apparatus of FIG. 8 comprises all the elements already discussed with reference to FIG. 7, and further comprises a prediction unlit 90, coupled between the data expansion unit 74 and the retrieval unit 80 and a converter unit 77. The prediction unit 90 comprise a predictor 92 and a signal combining unit 94, which is in the form of an adder. The predictor 92 generates a prediction of the signal applied to its input and supplies the predicted version at its output. The signal combination unit 94 adds the replica of the original residual composite signal to the predicted version of the composite signal so as to obtain the replica of the composite signal, which is supplied to the output 96 of the prediction unit 90.

FIG. 8 also shows a further elaboration of the control signal generator unit 75', which comprises a series connection of the predictor 92 and the converter unit 77. The converter unit 77 generates the statistical signal, used as the control signal for the data expansion unit 74, from the predictor output signal.

It should further be noted that the prediction unit 90 in the embodiment of FIG. 8 could have a circuit construction as shown in FIG. 2.

Figure 9:
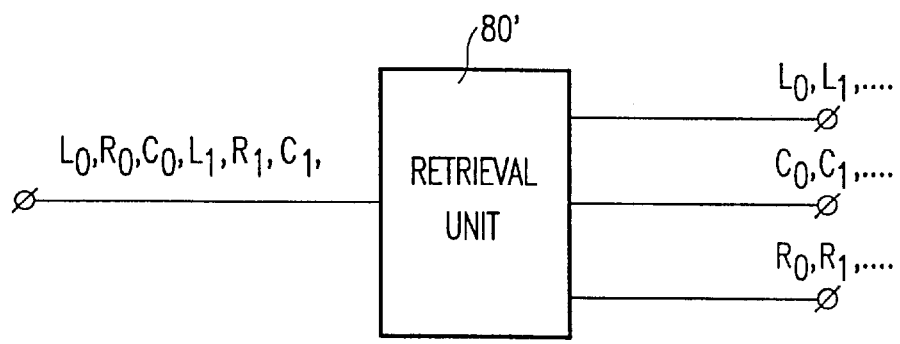
FIG. 9 shows another embodiment of the retrieval unit.

A retrieval unit of again another embodiment of the data expansion apparatus is shown in FIG. 9. The retrieval unit or means 80' of FIG. 9 is capable of retrieving three information signals from the replica of the composite signal. In the present example, the three information signals are the left and right hand signal component of a stereo audio signal and a corresponding centre signal.

Figure 10:
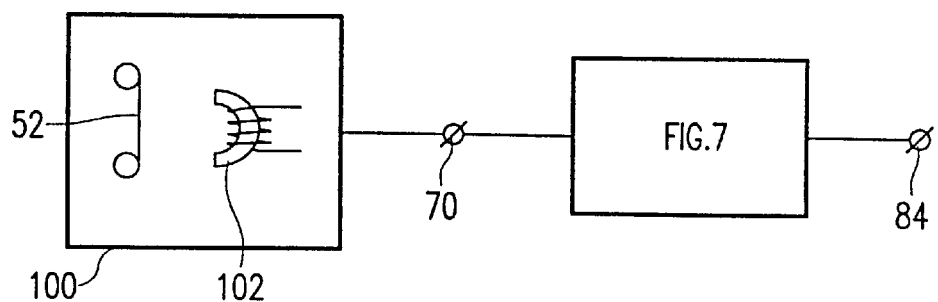
FIG. 10 shows the data expansion apparatus of FIG. 7 incorporated in a reproducing apparatus for reproducing the data compressed composite signal from a record carrier.

FIG. 10 shows the data expansion apparatus of FIG. 7 incorporated in a reproduction apparatus. The reproducing apparatus further comprises a read unit 100 for reading the data compressed composite signal from a track on the record carrier 52. In the present example, the record carrier 52 is a magnetic record carrier, so that the read unit 100 comprises at least one magnetic head 102 for reading the data compressed composite signal from the record carrier 52. The record carrier may however be an optical record carrier, such as a CD disk or a DVD disk.

Figure 11:
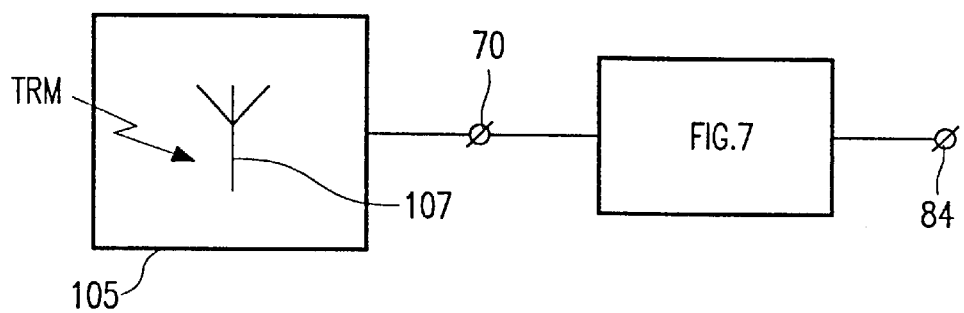
FIG. 11 shows the data expansion apparatus of FIG. 7 incorporated in a receiving apparatus for receiving the data compressed composite signal from a transmission medium.

FIG. 11 shows an embodiment of a receiver for receiving the data compressed composite signal via a transmission medium TRM, comprising the data expansion apparatus as shown in FIG. 7. The receiver further comprises a receiving unit 105 for receiving the data compressed composite signal from the transmission medium TRM. The receiving unit 105 could comprise an antenna 107.

Figure 12:
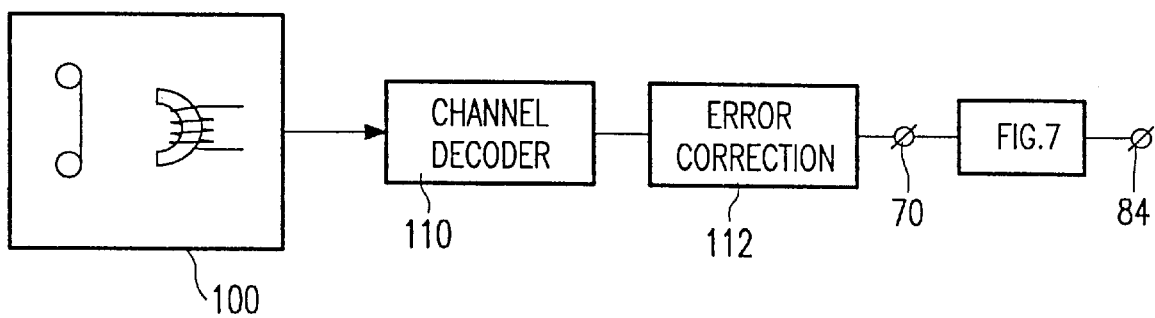
FIG. 12 shows a further embodiment of the reproducing apparatus, further provided with a channel decoder and an error correction unit.

As has been explained above, transmission via a transmission medium, such as a radio frequency link or a record carrier, generally requires an error correction encoding and a channel encoding carried out on the residual signal to be transmitted, so that a corresponding channel decoding and error correction can be carried out upon reception. FIG. 12 shows the signal processing steps of channel decoding and error correction carried out on the received signal, received by the reading means 100 for the reproducing arrangement of FIG. 10. The reproducing arrangement of FIG. 12 therefore comprise a channel decoder 110, well known in the art, and an error correction unit 112, also well known in the art, so as to obtain a replica of the data compressed composite signal.

Whilst the invention has been described with reference to preferred embodiments thereof, it is to be understood that these are not limitative examples. Thus, various modifications may become apparent to those skilled in the art, without departing from the scope of the invention, as defined by the claims. Thus, as has been said above, it is possible to combine more than two information signals into a composite signal in order to realize data compression.

Further, the invention lies in each and every novel feature or combination of features.

List of Related Documents (D1) EP-A 402,973 (PHN 13.241)
(D2) 'A method for the construction of minimum-redundancy codes', by D. A. Huffman in Proc. of the IRE, Vol. 40(10), September 1952.
(D3) 'An introduction to arithmetic coding' by G. G. Langdon, IBM J. Res. Develop., Vol. 28(2), March 1984.
(D4) 'A universal algorithm for sequential data compression' by J. Ziv et al, Trans. on Inform. Theory, Vol. IT-23, 1977.

What is claimed is:

1. A data compression apparatus for data compressing at least a first and second digital information signal, each of the at least two digital information signals comprising subsequent samples, the apparatus comprising:

means for receiving the first and second digital information signal;

signal combination means for combining the first and second digital information signal to obtain a composite information signal;

data compression means for data compressing the composite information signal to obtain a data compressed composite information signal;

output means for supplying the data compressed composite information signal, wherein the signal combination means comprises merging means for merging samples of the first and second digital information signal after each other into one datastream to obtain said composite information signal;

said data compression means having a control input for receiving a control signal, the data compression means being adapted to data compress the composite information signal in response to said control signal, control signal generation means being available for generating said control signal, said control signal generation means having an input for receiving said composite information signal and being adapted to generate said control signal in response to said composite information signal.

2. A data compression apparatus as claimed in claim 1, wherein said control signal is representative of a statistical parameter of the composite signal.

3. Apparatus as claimed in claim 1, for data compressing a number of n digital information signals, where n≦2, characterized in that the signal combination means are adapted to cyclically merge one sample of each of the n digital information signals after each other into said composite information signal.

4. Apparatus as claimed in claim 1, characterized in that the data compression means comprise lossless compression means.

5. A data compression apparatus for data compressing at least a first and a second digital information signal, each of the at least two digital information signals comprising subsequent samples, the apparatus comprising:

means for receiving the first and second digital information signal;

signal combination means for combining the first and second digital information signal to obtain a composite information signal;

data compression means for data compressing the composite information signal so as to obtain a data compressed composite information signal;

output means for supplying the data compressed composite information signal, wherein the signal combination means comprises merging means for merging samples of the first and second digital information signal after each other into one datastream to obtain said composite information signal;

said data compression means having a control input for receiving a control signal, the data compression means being adapted to data compress the composite information signal in response to said control signal, control signal generation means being available, for generating said control signal, said control signal generation means having an input for receiving said composite information signal and being adapted to generate said control signal in response to said composite information signal;

said data compression means comprising lossless compression means; and said data compression apparatus further comprising prediction means for carrying out a prediction step on the composite information signal to obtain a residual composite signal, the lossless compression means being adapted to carry out a lossless compression step on the residual composite signal to obtain said data compressed composite information signal.

6. Apparatus as claimed in claim 4, characterized in that the lossless compression means comprise a Huffman type encoder or an arithmetic coder.

7. Transmitter for transmitting a data compressed digital information signal via a transmission medium, wherein the transmitter comprises the data compression apparatus as claimed in claim 1, the transmitter further comprising means for applying the data compressed composite information signal to the transmission medium.

8. Transmitter as claimed in claim 7, wherein the transmitter further comprises error correction encoding means and/or channel encoding means, for error correction encoding and/or channel encoding the data compressed composite information signal prior to applying the data compressed composite information signal to the transmission medium.

9. Transmitter as claimed in claim 7, which is in the form of a recording apparatus for recording the data compressed composite information signal in a track on a record carrier, comprising writing means for writing the data compressed composite information signal on the record carrier.

10. A data expansion apparatus for data expanding a data compressed composite information signal obtained from at least a first and second digital information signal, formed from the merging of samples of the first and second digital information signal after each other, the apparatus comprising:

input means for receiving the data compressed composite information signal;

data expansion means for data expanding the data compressed composite information signal to obtain a data expanded composite information signal;

retrieval means for retrieving a replica of the first and second digital information signal from the data expanded composite information signal;

output means for supplying the replicas of at least the first and second digital information signals, wherein the retrieval means are adapted to retrieve individual samples from the data expanded composite signal to obtain said replicas of the at least first and second digital information signals;

said data expansion means having a control input for receiving a control signal, the data expansion means being adapted to data expand the data compressed composite information signal in response to said control signal to obtain said data expanded composite information signal, control signal generation means being available, for generating said control signal, said control signal generation means having an input for receiving said data expanded composite information signal and being adapted to generate said control signal in response to said data expanded composite information signal.

11. A data expansion apparatus as claimed in claim 10, wherein said control signal is representative of a statistical parameter of the data expanded composite signal.

12. Apparatus as claimed in claim 10, for data expanding a data compressed composite information signal obtained from a number of n digital information signals, where $n \geq 2$, characterized in that the retrieval means are adapted to cyclically retrieve one sample of each of the n digital information signals after each other from said data expanded composite information signal.

13. Apparatus as claimed in claim 10, characterized in that the data expansion means comprise lossless expansion means.

14. A data expansion apparatus for data expanding a data compressed composite information signal obtained from at least a first and a second digital information signal, the apparatus comprising:

input means for receiving the data compressed composite information signal;

data expansion means for data expanding the data compressed composite information signal to obtain a data expanded composite information signal;

retrieval means for retrieving a replica of the first and second digital information signal from the data expanded composite information signal;

output means for supplying the replicas of at least the first and second digital information signals, wherein the retrieval means are adapted to retrieve individual samples from the data expanded composite signal to obtain said replicas of the at least first and second digital information signals;

said data expansion means having a control input for receiving a control signal, the data expansion means being adapted to data expand the data compressed composite information signal in response to said control signal to obtain said data expanded composite information signal, control signal generation means being available, for generating said control signal, said control signal generation means having an input for receiving said data expanded composite information signal and being adapted to generate said control signal in response to said data expanded composite information signal;

said data expansion means comprising lossless expansion means; and said data expansion apparatus further comprising prediction means for carrying out a prediction step on the signal supplied by the lossless expansion means to obtain said data expanded composite information signal.

15. Receiver for receiving a data compressed composite information signal from a transmission medium, wherein the receiver comprises the data expansion apparatus as claimed in claim 10, the receiver further comprising receiver means for receiving the data compressed composite information signal from the transmission medium.

16. Receiver as claimed in claim 15, wherein the receiver further comprises channel decoding means and/or error correction means, for channel decoding and/or error correcting the data compressed composite information signal prior to data expanding the data compressed composite information signal.

17. Receiver as claimed in claim 15, which is in the form of a reproducing apparatus for reproducing the data compressed composite information signal from a track on a record carrier, comprising reading means for reading the data compressed composite information signal from the record carrier.

18. A method of data compressing at least a first and second digital information signal, each of the at least two digital information signals comprising subsequent samples, the method comprising the steps of:

receiving a composite information signal having samples of the first and second digital information signal merged after each other into one datastream;

generating a control signal form said composite information signal;

data compressing the composite information signal in response to said control signal to obtain a data compressed composite information signal; and supplying the data compressed composite information signal.

19. The method of claim 18, characterized in that the receiving step comprises the substeps of receiving the first and second digital information signal, merging the samples of the first and second digital information signal after each other into one datastream so as to obtain said composite information signal.

20. A method of data expanding a data compressed composite information signal obtained from at least a first and second digital information signal, the method comprising the steps of:

receiving the data compressed composite information signal;

data expanding the data compressed composite information signal in response to a control signal to obtain a data expanded composite information signal, the data expanded composite information signal comprising samples of the first and second digital information signal merged after each other into one datastream; and generating said control signal from said data expanded composite information signal.

21. The method of claim 20, further characterized by the steps of retrieving individual samples from the data expanded composite signal so as to obtain replicas of the at least first and second digital information signals, supplying the replicas of at least the first and second digital information signals.

22. Record carrier obtained with the transmitter as claimed in claim 9, comprising the data compressed composite signal recorded in a track on said record carrier.

* * * * *